United States Patent
Maeda et al.

(10) Patent No.: US 12,110,408 B2
(45) Date of Patent: Oct. 8, 2024

(54) CONDUCTIVE LAMINATE AND MANUFACTURING METHOD OF CONDUCTIVE LAMINATE

(71) Applicant: FUJIFILM Corporation, Tokyo (JP)

(72) Inventors: Kotaro Maeda, Kanagawa (JP); Norihide Shimohara, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 18/173,773

(22) Filed: Feb. 23, 2023

(65) Prior Publication Data

US 2023/0212413 A1 Jul. 6, 2023

Related U.S. Application Data

(63) Continuation of application No. PCT/JP2021/035589, filed on Sep. 28, 2021.

(30) Foreign Application Priority Data

Sep. 30, 2020 (JP) ................................ 2020-165595

(51) Int. Cl.
| | | |
|---|---|---|
| C09D 11/52 | (2014.01) | |
| B41M 5/00 | (2006.01) | |
| C09D 1/00 | (2006.01) | |
| C09D 11/322 | (2014.01) | |
| H05K 1/09 | (2006.01) | |
| H05K 3/12 | (2006.01) | |

(52) U.S. Cl.
CPC .......... *C09D 11/52* (2013.01); *B41M 5/0047* (2013.01); *C09D 1/00* (2013.01); *C09D 11/322* (2013.01); *H05K 1/097* (2013.01); *H05K 3/125* (2013.01)

(58) Field of Classification Search
CPC ...... B41M 5/0047; C09D 1/00; C09D 11/322; C09D 11/52; H05K 1/097; H05K 3/125
See application file for complete search history.

(56) References Cited

U.S. PATENT DOCUMENTS

| | | | |
|---|---|---|---|
| 11,877,391 B2 | 1/2024 | Kamijo et al. | |
| 2010/0193224 A1 | 8/2010 | Park | |
| 2012/0177897 A1 | 7/2012 | Jablonski et al. | |
| 2015/0129290 A1 | 5/2015 | Seong et al. | |

FOREIGN PATENT DOCUMENTS

| | | | |
|---|---|---|---|
| CN | 104246973 | | 12/2014 |
| JP | 2007286152 | | 11/2007 |
| JP | 2010183082 | | 8/2010 |
| JP | 2013042098 | | 2/2013 |
| JP | 2015514265 | | 5/2015 |
| JP | 2018041939 | | 3/2018 |
| JP | 2020142524 A | * | 9/2020 |
| WO | 2012026033 | | 3/2012 |
| WO | 2020027162 | | 2/2020 |

OTHER PUBLICATIONS

Machine Translation of JP 2020-142524 A (Year: 2020).*
"Notice of Reasons for Refusal of China Counterpart Application", issued on Sep. 1, 2023, with English translation thereof, p. 1-p. 19.
"International Search Report (Form PCT/ISA/210) of PCT/JP2021/035589", mailed on Dec. 14, 2021, with English translation thereof, pp. 1-5.
"Written Opinion of the International Searching Authority (Form PCT/ISA/237) of PCT/ JP2021/035589", mailed on Dec. 14, 2021, with English translation thereof, pp. 1-8.
"Office Action of Japan Counterpart Application", issued on May 28, 2024, with English translation thereof, pp. 1-8.

* cited by examiner

Primary Examiner — Christopher M Polley
Assistant Examiner — Sathavaram I Reddy
(74) Attorney, Agent, or Firm — JCIPRNET

(57) ABSTRACT

Provided is a conductive laminate including a base material and a conductive ink film provided on the base material, in which a region that extends from a first main surface toward a second main surface to a position being away from the first main surface by a distance equivalent to 50% of a thickness of the conductive ink film has a first void ratio of 15% to 50%, a region that extends from a position being away from the second main surface toward the first main surface by a distance equivalent to 10% of the thickness of the conductive ink film to the second main surface has a second void ratio which is smaller than the first void ratio, and the conductive ink film comprises at least one metal selected from the group consisting of silver, gold, platinum, nickel, palladium, and copper.

16 Claims, No Drawings

CONDUCTIVE LAMINATE AND MANUFACTURING METHOD OF CONDUCTIVE LAMINATE

CROSS-REFERENCE TO RELATED APPLICATION

This application is a Continuation of International Application No. PCT/JP2021/035589, filed Sep. 28, 2021, which claims priority to Japanese Patent Application No. 2020-165595 filed Sep. 30, 2020. Each of the above applications is hereby expressly incorporated by reference, in its entirety, into the present application.

BACKGROUND OF THE INVENTION

1. Field of the Invention

The present disclosure relates to a conductive laminate and a manufacturing method of the conductive laminate.

2. Description of the Related Art

A conductive laminate composed of a base material and a conductive film provided on the base material is used as an electronic material for manufacturing various electronic devices.

For example, JP2010-183082A describes a substrate including a base material and a conductive pattern that is provided on the base material and contains conductive inorganic metal particles and an organic metal complex providing a conductive channel between at least some of the conductive inorganic metal particles.

SUMMARY OF THE INVENTION

In some cases, a conductive laminate is required to satisfy both the low surface resistivity and thermal cycle stability.

The present disclosure has been made in consideration of the above circumstances. According to an embodiment of the present invention, there are provided a conductive laminate having a low surface resistivity and excellent thermal cycle stability and a manufacturing method of the conductive laminate.

The present disclosure includes the following aspects.

<1> A conductive laminate comprising a base material and a conductive ink film provided on the base material, in which in a case where a surface of the conductive ink film close to the base material is defined as a first main surface, and a surface of the conductive ink film far from the base material is defined as a second main surface, a first void ratio in a region that extends from the first main surface toward the second main surface to a position being away from the first main surface by a distance equivalent to 50% of a thickness of the conductive ink film is 15% to 50%, and a second void ratio in a region that extends from a position being away from the second main surface toward the first main surface by a distance equivalent to 10% of the thickness of the conductive ink film to the second main surface is lower than the first void ratio.

<2> The conductive laminate described in <1>, in which the first void ratio is 30% to 40%.

<3> The conductive laminate described in <1> or <2>, in which the second void ratio is 20% or less.

<4> The conductive laminate described in any one of <1> to <3>, in which the conductive ink film contains at least one metal selected from the group consisting of silver, gold, platinum, nickel, palladium, and copper.

<5> The conductive laminate described in any one of <1> to <4>, in which the conductive ink film has a thickness of 0.5 µm to 30 µm.

<6> A manufacturing method of the conductive laminate described in any one of <1> to <5>, the manufacturing method including a step of applying a first conductive ink containing metal particles onto a base material, a step of baking the first conductive ink, a step of applying a second conductive ink containing a metal salt or a metal complex onto the baked first conductive ink, and a step of baking the second conductive ink.

<7> The manufacturing method of the conductive laminate described in <6>, in which the metal particles are particles containing at least one metal selected from the group consisting of silver, gold, platinum, nickel, palladium, and copper.

<8> The manufacturing method of the conductive laminate described in <6> or <7>, in which the metal particles have an average particle diameter of 10 nm to 200 nm.

<9> The manufacturing method of the conductive laminate described in any one of <6> to <8>, in which a content of the metal particles is 10% by mass to 90% by mass with respect to a total amount of the first conductive ink.

<10> The manufacturing method of the conductive laminate described in any one of <6> to <9>, in which each of the metal salt and the metal complex contains at least one metal selected from the group consisting of silver, gold, platinum, nickel, palladium, and copper.

<11> The manufacturing method of the conductive laminate described in any one of <6> to <10>, in which the metal complex is a metal complex having a structure derived from at least one compound selected from the group consisting of an ammonium carbamate-based compound, an ammonium carbonate-based compound, an alkylamine, and a carboxylic acid having 8 to 20 carbon atoms, and the metal salt is a metal carboxylate having 8 to 20 carbon atoms.

<12> The manufacturing method of the conductive laminate described in any one of <6> to <11>, in which a content of each of the metal salt and the metal complex is 10% by mass to 90% by mass with respect to a total amount of the second conductive ink.

<13> The manufacturing method of the conductive laminate described in any one of <6> to <12>, in which the first conductive ink is applied using an ink jet recording method in the step of applying a first conductive ink, and the second conductive ink is applied using an ink jet recording method in the step of applying a second conductive ink.

<14> The manufacturing method of the conductive laminate described in any one of <6> to <13>, in which at the time of applying the first conductive ink in the step of applying a first conductive ink, a temperature of the base material is 20° C. to 120° C.

<15> The manufacturing method of the conductive laminate described in any one of <6> to <14>, in which in the step of baking the first conductive ink, a baking temperature is 250° C. or lower, and a baking time is 1 minute to 120 minutes.

<16> The manufacturing method of the conductive laminate described in any one of <6> to <15>, in which at the time of applying the second conductive ink in the step of applying a second conductive ink, a temperature of the base material is 20° C. to 120° C.

<17> The manufacturing method of the conductive laminate described in any one of <6> to <16>, in which in the step of baking the second conductive ink, a baking temperature is 250° C. or lower, and a baking time is 1 minute to 120 minutes.

<18> The manufacturing method of the conductive laminate described in any one of <6> to <17>, in which a time from when the step of applying a first conductive ink has finished to when the step of baking the first conductive ink is started is 60 seconds or less.

According to the present disclosure, there are provided a conductive laminate having a low surface resistivity and excellent thermal cycle stability, and a manufacturing method of the conductive laminate.

DESCRIPTION OF THE PREFERRED EMBODIMENTS

Hereinafter, the conductive laminate and the manufacturing method of the conductive laminate of the present disclosure will be specifically described.

In the present specification, a range of numerical values described using "to" means a range including numerical values described before and after "to" as a minimum value and a maximum value, respectively.

Regarding the ranges of numerical values described stepwise in the present specification, the upper limit or the lower limit described in a certain range of numerical values may be replaced with the upper limit or the lower limit of another range of numerical values described stepwise. In addition, in the ranges of numerical values described in the present specification, the upper limit or the lower limit described in a certain range of numerical values may be replaced with the value shown in Examples.

In the present specification, in a case where there is a plurality of substances in a composition that corresponds to each component of the composition, unless otherwise specified, the amount of each component of the composition means the total amount of the plurality of substances present in the composition.

In the present specification, a combination of two or more preferred embodiments is a more preferred embodiment.

In the present specification, the term "step" includes not only an independent step but also a step which is not clearly distinguished from another step as long as the intended purpose of the step is achieved.

In the present specification, "image" means general films, and "image recording" means the formation of an image (that is, a film). In the present specification, the concept of "image" also includes a solid image.

In the present specification, "thermal cycle stability" means that the conductive laminate has properties of experiencing a small change in a surface resistivity in a case where the conductive laminate is repeatedly heated and cooled.

[Conductive Laminate]

The conductive laminate of the present disclosure comprises a base material and a conductive ink film provided on the base material, in which in a case where a surface of the conductive ink film close to the base material is defined as a first main surface, and a surface of the conductive ink film far from the base material is defined as a second main surface, a first void ratio in a region that extends from the first main surface toward the second main surface to a position being away from the first main surface by a distance equivalent to 50% of a thickness of the conductive ink film is 15% to 50%, and a second void ratio in a region that extends from a position being away from the second main surface toward the first main surface by a distance equivalent to 10% of the thickness of the conductive ink film to the second main surface is lower than the first void ratio.

The inventors of the present invention paid attention to the void ratios in specific regions in the conductive ink film. As a result, the inventors have found that in a case where the first void ratio is 15% to 50%, and the second void ratio is lower than the first void ratio, a low surface resistivity and high thermal cycle stability can be simultaneously achieved.

In the conductive laminate of the present disclosure, the first void ratio of the conductive ink film is 15% or more. Therefore, even though the conductive laminate experiences volume change such as expansion or contraction due to heat, defects such as peeling or breakage do not occur, and excellent thermal cycle stability is exhibited. Furthermore, because the first void ratio of the conductive ink film in the conductive laminate of the present disclosure is 50% or less, the surface resistivity is reduced.

In the conductive laminate of the present disclosure, the second void ratio of the conductive ink film is lower than the first void ratio. That is, because the region around the surface of the conductive ink film is dense, the surface resistivity is reduced.

Incidentally, JP2010-183082A does not pay attention to the void ratio of the conductive ink film. Furthermore, in a case where a conductive laminate is prepared by the method disclosed in JP2010-183082A, the void ratio is substantially constant in the entire conductive ink film, and a low surface resistivity and high thermal cycle stability could not be simultaneously achieved.

<Base Material>

The conductive laminate of the present disclosure comprises a base material.

The material of the base material is not particularly limited, and can be selected depending on the purpose. Specifically, examples of the material of the base material include synthetic resins such as polyimide, polyethylene terephthalate, polybutylene terephthalate, polytrimethylene terephthalate, polyethylene naphthalate, polybutylene naphthalate, polycarbonate, polyurethane, polyethylene, polypropylene, polyvinyl chloride, polystyrene, polyvinyl acetate, an acrylic resin, an acrylonitrile styrene resin (AS resin), an acrylonitrile-butadiene-styrene copolymer (ABS resin), triacetyl cellulose, polyamide, polyacetal, polyphenylene sulfide, polysulfone, an epoxy resin, a glass epoxy resin, a melamine resin, a phenol resin, a urea resin, an alkyd resin, a fluororesin, and polylactic acid; inorganic materials such as copper, steel, aluminum, silicon, soda glass, alkali-free glass, and indium tin oxide (ITO); and papers such as base paper, art paper, coated paper, cast coated paper, resin coated paper, and synthetic paper. The base material may be composed of one layer or two or more layers. In a case where the base material is composed of two or more layers, two or more base materials made of different materials may be laminated.

The base material is preferably in the form of a sheet or film. The thickness of the base material is preferably 20 μm to 2,000 μm. In a case where the thickness of the base material is 20 μm or more, the conductive ink film can be stably maintained, and the handleability of the laminate on which the conductive ink film is formed is also improved.

The base material may have an ink receiving layer. The thickness of the ink receiving layer is preferably 1 μm to 20 μm. In a case where the thickness of the ink receiving layer is 1 μm to 20 μm, the ink receiving layer can be more stably maintained, and the conductive ink more homogeneously wets and spreads on the base material, which further improves the quality of the conductive ink film. The ink receiving layer is a coating layer formed on the base material to absorb and fix ink.

In the conductive laminate of the present disclosure, from the viewpoint of insulating properties and adhesiveness, the base material is preferably a glass base material or a plastic base material.

<Conductive Ink Film>

In the conductive laminate of the present disclosure, the conductive ink film is provided on the base material. Although another layer may be provided between the conductive ink film and the base material, it is preferable that the conductive ink film be provided directly on the base material.

In the present disclosure, "conductivity" refers to properties of having a surface resistivity of $1 \times 10^4$ Ω/square or less.

In a case where a surface of the conductive ink film close to the base material is defined as a first main surface, and a surface of the conductive ink film far from the base material is defined as a second main surface, a first void ratio in a region that extends from the first main surface toward the second main surface to a position being away from the first main surface by a distance equivalent to 50% of a thickness of the conductive ink film is 15% to 50%, and a second void ratio in a region that extends from a position being away from the second main surface toward the first main surface by a distance equivalent to 10% of the thickness of the conductive ink film to the second main surface is lower than the first void ratio.

In brief, in a case where the conductive ink film is divided into regions in a thickness direction, the first void ratio in a 50% region on a base material side in the thickness direction is 15% to 50%, and the second void ratio in a 10% region on a non-base material side in the thickness direction is lower than the first void ratio. In a case where the first void ratio is 15% or more, even though the conductive laminate experiences volume change such as expansion or contraction due to heat, defects such as peeling or breakage do not occur, and excellent thermal cycle stability is exhibited. In contrast, in a case where the first void ratio is 50% or less, the surface resistivity is reduced.

Having the second void ratio lower than the first void ratio means that the 10% region on the non-base material side is denser than the 50% region on the base material side in the conductive ink film. In a case where the 10% region on the non-base material side is dense, the surface resistivity is reduced.

From the viewpoint of further improving the thermal cycle stability, the first void ratio is preferably 30% to 40%.

From the viewpoint of further reducing the surface resistivity, the second void ratio is preferably 20% or less, more preferably 10% or less, and even more preferably 7% or less. The lower limit of the second void ratio is not particularly limited, and is, for example, 0%.

The difference between the first void ratio and the second void ratio is not particularly limited. From the viewpoint of achieving both the low surface resistivity and thermal cycle stability, the difference is preferably 5% to 40%, and more preferably 20% to 30%.

The void ratio in the conductive ink film can be controlled by the type of conductive ink for forming the conductive ink film and baking conditions after the application of the conductive ink. For example, in a case where an ink containing metal particles is used as the conductive ink, it is easy to form voids in the conductive ink film. In a case where an ink containing the metal particles is used, and the baking temperature is set to a high temperature, the void ratio is reduced. In addition, in a case where the baking time is increased, the void ratio is reduced.

The void ratio is measured, for example, by the following method.

By using a microtome (trade name RM2255, manufactured by Leica Biosystems Nussloch GmbH), the conductive laminate is cut in a thickness direction of the conductive laminate, thereby obtaining a cross section. By using the cross section and a scanning electron microscope (trade name S-4700, manufactured by Hitachi High-Tech Corporation.), a cross-sectional observation image is obtained.

By using image software ("Adobe Photoshop" manufactured by Adobe Systems, Inc.), threshold values of the obtained cross-sectional observation image are adjusted to obtain a binary image including a white region where a conductive substance is present and a black region where voids are present. In the obtained image, the projection portions at five upper points and the recess portions at five lower points on the side of the ink film surface are averaged, and the position obtained in this way is adopted as an upper side. Furthermore, for the base material side of the ink film, the same calculation as above is performed, and the position obtained by the calculation is adopted as a lower side. The space between the upper side and the lower side is divided into 10 equal parts, and a region from the lower side to the 5th part is defined as a 50% region on the base material side, and a region from the 9th part from the base material side to the upper region is defined as a 10% region on the non-base material side.

The first void ratio is calculated as a ratio of the area of the black region (void) to the total area of the 50% region on the base material side in the cross-sectional observation image.

The second void ratio is calculated as a ratio of the area of the black region (void) to the total area of the 10% region on the non-base material side in the cross-sectional observation image.

The conductive ink film preferably contains a conductive substance, and the conductive substance is preferably a metal. Examples of the metal include a base metal and a noble metal. Examples of the base metal include nickel, titanium, cobalt, copper, chromium, manganese, iron, zirconium, tin, tungsten, molybdenum, and vanadium. Examples of the noble metal include gold, silver, platinum, palladium, iridium, osmium, ruthenium, rhodium, rhenium, and alloys containing these metals. From the viewpoint of conductivity, the conductive ink film preferably contains at least one metal selected from the group consisting of silver, gold, platinum, nickel, palladium, and copper, and more preferably contains silver.

In the conductive ink film, the content of a metal with respect to the total amount of the conductive ink film is preferably 5% by mass to 70% by mass, and more preferably 7% by mass to 50% by mass.

The thickness of the conductive ink film is not particularly limited. From the viewpoint of productivity and conductivity, the thickness of the conductive ink film is preferably 0.5 μm to 30 μm, and more preferably 5 μm to 20 μm.

[Manufacturing Method of Conductive Laminate]

The manufacturing method of the conductive laminate of the present disclosure is not particularly limited as long as the conductive ink film can be formed on a base material.

The conductive ink film can be formed, for example, by applying the conductive ink onto a base material, and then baking the conductive ink applied onto the base material. The conductive ink film may be formed by repeating the application of the conductive ink and the baking of the conductive ink film multiple times.

The conductive ink is preferably an ink containing metal particles (hereinafter, also called "metal particle ink"), an ink containing a metal complex (hereinafter, also called "metal complex ink"), or an ink containing a metal salt (hereinafter, also called "metal salt ink"), and more preferably a metal particle ink or a metal complex ink.

<Metal Particle Ink>

The metal particle ink is, for example, an ink composition obtained by dispersing metal particles in a dispersion medium.

(Metal Particles)

Examples of the metal constituting the metal particles include particles of a base metal and a noble metal. Examples of the base metal include nickel, titanium, cobalt, copper, chromium, manganese, iron, zirconium, tin, tungsten, molybdenum, and vanadium. Examples of the noble metal include gold, silver, platinum, palladium, iridium, osmium, ruthenium, rhodium, rhenium, and alloys containing these metals. Among these, from the viewpoint of conductivity, the metal constituting the metal particles preferably includes at least one metal selected from the group consisting of silver, gold, platinum, nickel, palladium, and copper, and more preferably includes silver.

The average particle diameter of the metal particles is not particularly limited, but is preferably 10 nm to 500 nm, and more preferably 10 nm to 200 nm. In a case where the average particle diameter is in the above range, the baking temperature of the metal particles is lowered, which improves the process suitability for preparing the conductive ink film. Particularly, in a case where the metal particle ink is applied using a spray method or an ink jet recording method, jettability is improved, which tends to improve pattern forming properties and film thickness uniformity of the conductive ink film. The average particle diameter mentioned herein means the average of primary particle diameters of the metal particles (average primary particle diameter).

For example, by using a laser diffraction/scattering-type particle size distribution analyzer (trade name "LA-960", manufactured by Horiba, Ltd.), a 50% cumulative volume-based diameter (D50) of the metal particles is measured three times, and the average of the diameters measured three times is calculated and adopted as the average particle diameter of the metal particles.

As necessary, the metal particle ink may contain metal particles having an average particle diameter of 500 nm or more. In a case where the metal particle ink contains metal particles having an average particle diameter of 500 nm or more, the nm-sized metal particles lower the melting point around the μm-sized metal particles, which makes it possible to bond the conductive ink film.

In the metal particle ink, the content of the metal particles with respect to the total amount of the metal particle ink is preferably 10% by mass to 90% by mass, and more preferably 20% by mass to 50% by mass. In a case where the content of the metal particles is 10% by mass or more, the surface resistivity is further reduced. In a case where the content of the metal particles is 90% by mass or less, jettability is improved in a case where the metal particle ink is applied using a spray method or an ink jet recording method.

In addition to the metal particles, the metal particle ink may contain, for example, a dispersant, a resin, a dispersion medium, a thickener, and a surface tension adjuster.

(Dispersant)

The metal particle ink may contain a dispersant that adheres to at least a part of the surface of the metal particles. The dispersant substantially constitutes metal colloidal particles, together with the metal particles. The dispersant has an action of coating the metal particles to improve the dispersibility of the metal particles and prevent aggregation. The dispersant is preferably an organic compound capable of forming metal colloidal particles. From the viewpoint of conductivity and dispersion stability, the dispersant is preferably an amine compound, a carboxylic acid, an alcohol, or a resin dispersant.

The metal particle ink may contain one dispersant or two or more dispersants.

Examples of the amine compound include saturated or unsaturated aliphatic amines. Among these, an aliphatic amine having 4 to 8 carbon atoms is preferable as the amine compound. The aliphatic amine having 4 to 8 carbon atoms may be linear or branched, or may have a ring structure.

Examples of the aliphatic amine include butylamine, normal pentylamine, isopentylamine, hexylamine, 2-ethylhexylamine, and octylamine.

Examples of the amine having an alicyclic structure include cycloalkylamines such as cyclopentylamine and cyclohexylamine.

Examples of an aromatic amine include aniline.

The amine compound may have a functional group other than an amino group. Examples of the functional group other than an amino group include a hydroxy group, a carboxy group, an alkoxy group, a carbonyl group, an ester group, and a mercapto group.

Examples of the carboxylic acid include formic acid, oxalic acid, acetic acid, hexanoic acid, acrylic acid, octylic acid, and oleic acid. The carboxy group which is a part of the carboxylic acid may form a salt with a metal ion. The salt may be formed of one metal ion or two or more metal ions.

The carboxylic acid may have a functional group other than the carboxy group. Examples of the functional group other than the carboxy group include an amino group, a hydroxy group, an alkoxy group, a carbonyl group, an ester group, and a mercapto group.

Examples of the alcohol include a terpene-based alcohol, an allyl alcohol, an oleyl alcohol, tianshic acid, ricinoleic acid, gallic acid, and salicylic acid. The alcohol is likely to be coordinated with the surface of the metal particles and can suppress aggregation of the metal particles.

Examples of the resin dispersant include a dispersant that has a nonionic group as a hydrophilic group and can be homogeneously dissolved in a solvent. Examples of the resin dispersant include polyvinylpyrrolidone, polyethylene glycol, a polyethylene glycol-polypropylene glycol copolymer, polyvinyl alcohol, polyallylamine, and a polyvinyl alcohol-polyvinyl acetate copolymer. The molecular weight of the resin dispersant is preferably 1,000 to 50,000, and more preferably 1,000 to 30,000, in terms of a weight-average molecular weight.

In the metal particle ink, the content of the dispersant with respect to the total amount of the metal particle ink is preferably 0.5% by mass to 50% by mass, and more preferably 1% by mass to 30% by mass.

(Dispersion Medium)

It is preferable that the metal particle ink contain a dispersion medium. The type of dispersion medium is not particularly limited, and examples thereof include a hydrocarbon, an alcohol, and water.

The metal particle ink may contain one dispersion medium or two or more dispersion media. It is preferable that the dispersion medium contained in the metal particle ink be volatile. The boiling point of the dispersion medium is preferably 50° C. to 250° C., more preferably 70° C. to 220° C., and even more preferably 80° C. to 200° C. In a case where the boiling point of the dispersion medium is 50° C. to 250° C., the stability and baking properties of the metal particle ink tend to be simultaneously achieved.

Examples of the hydrocarbon include an aliphatic hydrocarbon and an aromatic hydrocarbon.

Examples of the aliphatic hydrocarbon include a saturated or unsaturated aliphatic hydrocarbon such as tetradecane, octadecane, heptamethylnonane, tetramethylpentadecane, hexane, heptane, octane, nonane, decane, tridecane, methylpentane, normal paraffin, or isoparaffin.

Examples of the aromatic hydrocarbon include toluene and xylene.

Examples of the alcohol include an aliphatic alcohol and an alicyclic alcohol. In a case where an alcohol is used as the dispersion medium, the dispersant is preferably an amine compound or a carboxylic acid.

Examples of the aliphatic alcohol include a saturated or unsaturated aliphatic alcohol having 6 to 20 carbon atoms that may contain an ether bond in a chain, such as heptanol, octanol (for example, 1-octanol, 2-octanol, 3-octanol, or the like), decanol (for example, 1-decanol or the like), lauryl alcohol, tetradecyl alcohol, cetyl alcohol, 2-ethyl-1-hexanol, octadecyl alcohol, hexadecenol, and oleyl alcohol.

Examples of the alicyclic alcohol include a cycloalkanol such as cyclohexanol; a terpene alcohol such as terpineol (including α, β, and γ isomers, or any mixture of these) or dihydroterpineol; myrtenol, sobrerol, menthol, carveol, perillyl alcohol, pinocarveol, and verbenol.

The dispersion medium may be water. From the viewpoint of adjusting physical properties such as viscosity, surface tension, and volatility, the dispersion medium may be a mixed solvent of water and another solvent. Another solvent to be mixed with water is preferably an alcohol. The alcohol used together with water is preferably an alcohol that is miscible with water and has a boiling point of 130° C. or lower. Examples of the alcohol include 1-propanol, 2-propanol, 1-butanol, 2-butanol, tert-butanol, 1-pentanol, ethylene glycol monomethyl ether, ethylene glycol monoethyl ether, ethylene glycol monopropyl ether, propylene glycol monomethyl ether.

In the metal particle ink, the content of the dispersion medium is preferably 1% by mass to 50% by mass with respect to the total amount of the metal particle ink. In a case where the content of the dispersion medium is 1% by mass to 50% by mass, the metal particle ink can obtain sufficient conductivity as a conductive ink. The content of the dispersion medium is more preferably 10% by mass to 45% by mass, and even more preferably 20% by mass to 40% by mass.

(Resin)

The metal particle ink may contain a resin. Examples of the resin include polyester, polyurethane, a melamine resin, an acrylic resin, a styrene-based resin, a polyether resin, and a terpene resin.

The metal particle ink may contain one resin or two or more resins.

In the metal particle ink, the content of the resin is preferably 0.1% by mass to 5% by mass with respect to the total amount of the metal particle ink.

(Thickener)

The metal particle ink may contain a thickener. Examples of the thickener include clay minerals such as clay, bentonite, and hectorite; cellulose derivatives such as methyl cellulose, carboxymethyl cellulose, hydroxyethyl cellulose, hydroxypropyl cellulose, and hydroxypropyl methyl cellulose; and polysaccharides such as xanthan gum and guar gum.

The metal particle ink may contain one thickener or two or more thickeners.

In the metal particle ink, the content of the thickener is preferably 0.1% by mass to 5% by mass with respect to the total amount of the metal particle ink.

(Surfactant)

The metal particle ink may contain a surfactant. In a case where the metal particle ink contains a surfactant, a uniform conductive ink film is likely to be formed.

The surfactant may be any of an anionic surfactant, a cationic surfactant, and a nonionic surfactant. Among these, as the surfactant, a fluorine-based surfactant is preferable, because this surfactant makes it possible to adjust the surface tension even though the metal particle ink contains a small amount of such a surfactant. Furthermore, the surfactant is preferably a compound having a boiling point higher than 250° C.

The viscosity of the metal particle ink is not particularly limited. The viscosity of the metal particle ink may be 0.01 Pa·s to 5,000 Pa·s, and is preferably 0.1 Pa·s to 100 Pas. In a case where the metal particle ink is applied using a spray method or an ink jet recording method, the viscosity of the metal particle ink is preferably 1 mPa·s to 100 mPa·s, more preferably 2 mPa·s to 50 mPa·s, and even more preferably 3 mPa·s to 30 mPa·s.

The viscosity of the metal particle ink is a value measured at 25° C. by using a viscometer. The viscosity is measured, for example, using a VISCOMETER TV-22 type viscometer (manufactured by TOKISANGYO).

The surface tension of the metal particle ink is not particularly limited, and is preferably 20 mN/m to 45 mN/m and more preferably 25 mN/m to 40 mN/m. The surface tension is a value measured at 25° C. by using a surface tensiometer. The surface tension is measured using, for example, DY-700 (manufactured by Kyowa Interface Science Co., Ltd.).

(Manufacturing Method of Metal Particles)

The metal particles may be a commercially available product or may be manufactured by a known method. Examples of the manufacturing method of the metal particles include a wet reduction method, a vapor phase method, and a plasma method. Preferred examples of the manufacturing method of the metal particles include a wet reduction method capable of manufacturing metal particles having an average particle diameter of 200 nm or less and having a narrow particle size distribution. Examples of the manufacturing method of the metal particles by a wet reduction method include the method described in JP2017-37761A, WO2014-57633A1, and the like, the method including a step of mixing a metal salt with a reducing agent to obtain a complexing reaction solution and a step of heating the complexing reaction solution to reduce metal ions in the complexing reaction solution and to obtain a slurry of metal nanoparticles.

In manufacturing the metal particle ink, a heating treatment may be performed such that the content of each component contained in the metal particle ink is adjusted to be in a predetermined range. The heating treatment may be performed under reduced pressure or under normal pressure. In a case where the heating treatment is performed under normal pressure, the heating treatment may be performed in the atmosphere or in an inert gas atmosphere.

<Metal Complex Ink>

The metal complex ink is, for example, an ink composition obtained by dissolving a metal complex in a solvent.

Examples of metals constituting the metal complex include silver, copper, gold, aluminum, magnesium, tungsten, molybdenum, zinc, nickel, iron, platinum, tin, copper, and lead. Among these, from the viewpoint of conductivity, the metal constituting the metal complex preferably includes at least one metal selected from the group consisting of silver, gold, platinum, nickel, palladium, and copper, and more preferably includes silver.

The content of the metal contained in the metal complex ink with respect to the total amount of the metal complex ink is preferably 1% by mass to 40% by mass, more preferably 5% by mass to 30% by mass, and even more preferably 7% by mass to 20% by mass, in terms of the metal element.

The metal complex can be obtained, for example, by reacting a metal salt with a complexing agent. Examples of the manufacturing method of the metal complex include a method of adding a metal salt and a complexing agent to an organic solvent and stirring the mixture for a predetermined time. The stirring method is not particularly limited, and can be appropriately selected from known methods such as a stirring method using a stirrer, a stirring blade, or a mixer, and a method of applying ultrasonic waves.

Examples of the metal salt include a metal oxide, thiocyanate, sulfide, chloride, cyanide, cyanate, carbonate, acetate, nitrate, nitrite, sulfate, phosphate, perchlorate, tetrafluoroborate, an acetyl acetonate complex salt, and carboxylate.

Examples of the complexing agent include an amine compound, an ammonium carbamate-based compound, an ammonium carbonate-based compound, an ammonium bicarbonate compound, and a carboxylic acid. Among these, from the viewpoint of the conductivity and the stability of the metal complex, it is preferable that the complexing agent include at least one compound selected from the group consisting of an ammonium carbamate-based compound, an ammonium carbonate-based compound, an alkylamine, and a carboxylic acid having 8 to 20 carbon atoms.

The metal complex has a structure derived from a complexing agent. It is preferable that the metal complex have a structure derived from at least one compound selected from the group consisting of an ammonium carbamate-based compound, an ammonium carbonate-based compound, an alkylamine, and a carboxylic acid having 8 to 20 carbon atoms.

Examples of the amine compound as a complexing agent include ammonia, a primary amine, a secondary amine, a tertiary amine, and a polyamine.

Examples of the primary amine having a linear alkyl group include methylamine, ethylamine, 1-propylamine, n-butylamine, n-pentylamine, n-hexylamine, heptylamine, octylamine, nonylamine, n-decylamine, undecylamine, dodecylamine, tridecylamine, tetradecylamine, pentadecylamine, hexadecylamine, heptadecylamine, and octadecylamine.

Examples of the primary amine having a branched alkyl group include isopropylamine, sec-butylamine, tert-butylamine, isopentylamine, 2-ethylhexylamine, and tert-octylamine.

Examples of the primary amine having an alicyclic structure include cyclohexylamine and dicyclohexylamine.

Examples of the primary amine having a hydroxyalkyl group include ethanolamine, diethanolamine, triethanolamine, N-methylethanolamine, propanolamine, isopropanolamine, dipropanolamine, diisopropanolamine, tripropanolamine, and triisopropanolamine.

Examples of the primary amine having an aromatic ring include benzylamine, N,N-dimethylbenzylamine, phenylamine, diphenylamine, triphenylamine, aniline, N,N-dimethyl aniline, N,N-dimethyl-p-toluidine, 4-aminopyridine, and 4-dimethylaminopyridine.

Examples of the secondary amine include dimethylamine, diethylamine, dipropylamine, dibutylamine, diphenylamine, dicyclopentylamine, and methylbutylamine.

Examples of the tertiary amine include trimethylamine, triethylamine, tripropylamine, and triphenylamine.

Examples of the polyamine include ethylenediamine, 1,3-diaminopropane, diethylenetriamine, triethylenetetramine, tetramethylenepentamine, hexamethylenediamine, tetraethylenepentamine, and a combination of these.

The amine compound is preferably an alkylamine, more preferably an alkylamine having 3 to 10 carbon atoms, and even more preferably a primary alkylamine having 4 to 10 carbon atoms.

The metal complex may be configured with one amine compound or two or more amine compounds.

In reacting the metal salt with an amine compound, the ratio of the molar amount of the amine compound to the molar amount of the metal salt is preferably 1/1 to 15/1, and more preferably 1.5/1 to 6/1. In a case where the above ratio is within the above range, the complex formation reaction goes to completion, and a transparent solution is obtained.

Examples of the ammonium carbamate-based compound as a complexing agent include ammonium carbamate, methyl ammonium methylcarbamate, ethylammonium ethylcarbamate, 1-propylammonium 1-propylcarbamate, isopropylammonium isopropylcarbamate, butylammonium butylcarbamate, isobutylammonium isobutylcarbamate, amylammonium amylcarbamate, hexylammonium hexylcarbamate, heptylammonium heptylcarbamate, octylammonium octylcarbamate, 2-ethylhexylammonium 2-ethylhexylcarbamate, nonylammonium nonylcarbamate, and decylammonium decylcarbamate.

Examples of the ammonium carbonate-based compound as a complexing agent include ammonium carbonate, methylammonium carbonate, ethylammonium carbonate, 1-propylammonium carbonate, isopropylammonium carbonate, butylammonium carbonate, isobutylammonium carbonate, amylammonium carbonate, hexylammonium carbonate, heptylammonium carbonate, octylammonium carbonate, 2-ethylhexylammonium carbonate, nonylammonium carbonate, and decylammonium carbonate.

Examples of the ammonium bicarbonate-based compound as a complexing agent include ammonium bicarbonate, methylammonium bicarbonate, ethylammonium bicarbonate, 1-propylammonium bicarbonate, isopropylammonium bicarbonate, butylammonium bicarbonate, isobutylammonium bicarbonate, amylammonium bicarbonate, hexylammonium bicarbonate, heptylammonium bicarbonate, octylammonium bicarbonate, 2-ethylhexylammonium bicarbonate, nonylammonium bicarbonate, and decylammonium bicarbonate.

In reacting the metal salt with an ammonium carbamate-based compound, an ammonium carbonate-based compound, or an ammonium bicarbonate-based compound, the ratio of the molar amount of the ammonium carbamate-based compound, the ammonium carbonate-based compound, or the ammonium bicarbonate-based compound to the molar amount of the metal salt is preferably 0.01/1 to 1/1, and more preferably 0.05/1 to 0.6/1.

Examples of the carboxylic acid as a complexing agent include caproic acid, caprylic acid, pelargonic acid, 2-ethylhexanoic acid, capric acid, neodecanoic acid, undecanoic acid, lauric acid, myristic acid, palmitic acid, stearic acid, palmitoleic acid, oleic acid, linoleic acid, and linolenic acid. Among these, as the carboxylic acid, a carboxylic acid having 8 to 20 carbon atoms is preferable, and a carboxylic acid having 10 to 16 carbon atoms is more preferable.

In the metal complex ink, the content of the metal complex with respect to the total amount of the metal complex ink is preferably 10% by mass to 90% by mass, and more preferably 10% by mass to 40% by mass. In a case where the content of the metal complex is 10% by mass or more, the surface resistivity is further reduced. In a case where the content of the metal complex is 90% by mass or less, jettability is improved in a case where the metal complex ink is applied using a spray method or an ink jet recording method.

(Solvent)

It is preferable that the metal complex ink contain a solvent. The solvent is not particularly limited as long as it can dissolve the component contained in the metal complex ink, such as the metal complex. From the viewpoint of ease of manufacturing, the boiling point of the solvent is preferably 30° C. to 300° C., more preferably 50° C. to 200° C., and even more preferably 50° C. to 150° C.

The content of the solvent in the conductive ink is preferably set such that the concentration of metal ions with respect to the metal complex (the amount of the metal present as free ions with respect to 1 g of the metal complex) is 0.01 mmol/g to 3.6 mmol/g, and more preferably set such that the aforementioned concentration of metal ions is 0.05 mmol/g to 2 mmol/g. In a case where the concentration of metal ions is within the above range, the metal complex ink has excellent fluidity and can obtain conductivity.

Examples of the solvent include a hydrocarbon, a cyclic hydrocarbon, an aromatic hydrocarbon, a carbamate, an alkene, an amide, an ether, an ester, an alcohol, a thiol, a thioether, phosphine, and water. The metal complex ink may contain only one solvent or two or more solvents.

The hydrocarbon is preferably a linear or branched hydrocarbon having 6 to 20 carbon atoms. Examples of the hydrocarbon include pentane, hexane, heptane, octane, nonane, decane, undecane, dodecane, tridecane, tetradecane, pentadecane, hexadecane, octadecane, nonadecane, and icosane. The cyclic hydrocarbon is preferably a cyclic hydrocarbon having 6 to 20 carbon atoms.

The cyclic hydrocarbons can include, for example, cyclohexane, cycloheptane, cyclooctane, cyclononane, cyclodecane, and decalin.

Examples of the aromatic hydrocarbon include benzene, toluene, xylene, and tetraline.

The ether may be any of a linear ether, a branched ether, and a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, and a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, icosyl alcohol, and isoicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

(Reducing Agent)

The metal complex ink may contain a reducing agent. In a case where the metal complex ink contains a reducing agent, the reduction of the metal complex into a metal is facilitated.

Examples of the reducing agent include a borohydride metal salt, an aluminum hydride salt, an amine compound, an alcohol, an organic acid, reduced sugar, a sugar alcohol, sodium sulfite, a hydrazine compound, dextrin, hydroquinone, hydroxylamine, ethylene glycol, glutathione, and an oxime compound.

The reducing agent may be the oxime compound described in JP2014-516463A. Examples of the oxime compound include acetone oxime, cyclohexanone oxime, 2-butanone oxime, 2,3-butanedione monoxime, dimethyl glyoxime, methyl acetoacetate monoxime, methyl pyruvate monoxime, benzaldehyde oxime, 1-indanone oxime, 2-adamantanone oxime, 2-methylbenzamide oxime, 3-methylbenzamide oxime, 4-methylbenzamide oxime, 3-aminobenzamide oxime, 4-aminobenzamide oxime, acetophenone oxime, benzamide oxime, and pinacolone oxime.

The metal complex ink may contain one reducing agent or two or more reducing agents.

The content of the reducing agent in the metal complex ink is not particularly limited, but is preferably 0.1% by mass to 20% by mass, more preferably 0.3% by mass to 10% by mass, and even more preferably 1% by mass to 5% by mass.

(Resin)

The metal complex ink may contain a resin. In a case where the metal complex ink contains a resin, the adhesiveness of the metal complex ink to the base material is improved.

Examples of the resin include polyester, polyethylene, polypropylene, polyacetal, polyolefin, polycarbonate, polyamide, a fluororesin, a silicone resin, ethyl cellulose, hydroxyethyl cellulose, rosin, an acrylic resin, polyvinyl chloride, polysulfone, polyvinylpyrrolidone, polyvinyl alcohol, a polyvinyl-based resin, polyacrylonitrile, polysulfide, polyamideimide, polyether, polyarylate, polyether ether ketone, polyurethane, an epoxy resin, a vinyl ester resin, a phenol resin, a melamine resin, and a urea resin.

The metal complex ink may contain one resin or two or more resins.

(Additive)

As long as the effects of the present disclosure are not reduced, the metal complex ink may further contain additives such as an inorganic salt, an organic salt, an inorganic oxide such as silica, a surface conditioner, a wetting agent, a crosslinking agent, an antioxidant, a rust inhibitor, a heat-resistant stabilizer, a surfactant, a plasticizer, a curing agent, a thickener, and a silane coupling agent. In the metal complex ink, the total content of additives is preferably 20% by mass or less with respect to the total amount of the metal complex ink.

The viscosity of the metal complex ink is not particularly limited. The viscosity of the metal complex ink may be 0.01 Pa·s to 5,000 Pa·s, and is preferably 0.1 Pa·s to 100 Pa·s. In a case where the metal complex ink is applied using a spray method or an ink jet recording method, the viscosity of the metal complex ink is preferably 1 mPa·s to 100 mPa·s, more preferably 2 mPa·s to 50 mPa·s, and even more preferably 3 mPa·s to 30 mPa·s.

The viscosity of the metal complex ink is a value measured at 25° C. by using a viscometer. The viscosity is measured, for example, using a VISCOMETER TV-22 type viscometer (manufactured by TOKISANGYO).

The surface tension of the metal complex ink is not particularly limited, and is preferably 20 mN/m to 45 mN/m and more preferably 25 mN/m to 35 mN/m. The surface tension is a value measured at 25° C. by using a surface tensiometer. The surface tension is measured using, for example, DY-700 (manufactured by Kyowa Interface Science Co., Ltd.).

<Metal Salt Ink>

The metal salt ink is, for example, an ink composition obtained by dissolving a metal salt in a solvent.

Examples of metals constituting the metal salt include silver, copper, gold, aluminum, magnesium, tungsten, molybdenum, zinc, nickel, iron, platinum, tin, copper, and lead. Among these, from the viewpoint of conductivity, the metal constituting the metal salt preferably includes at least one metal selected from the group consisting of silver, gold, platinum, nickel, palladium, and copper, and more preferably includes silver.

The content of the metal contained in the metal salt ink with respect to the total amount of the metal salt ink is preferably 1% by mass to 40% by mass, more preferably 5% by mass to 30% by mass, and even more preferably 7% by mass to 20% by mass, in terms of the metal element.

In the metal salt ink, the content of the metal salt with respect to the total amount of the metal salt ink is preferably 10% by mass to 90% by mass, and more preferably 10% by mass to 40% by mass. In a case where the content of the metal salt is 10% by mass or more, the surface resistivity is further reduced. In a case where the content of the metal salt is 90% by mass or less, jettability is improved in a case where the metal salt ink is applied using a spray method or an ink jet recording method.

Examples of the metal salt include benzoate, halide, carbonate, citrate, iodate, nitrite, nitrate, acetate, phosphate, sulfate, sulfide, trifluoroacetate, and carboxylate of a metal. It should be noted that two or more salts may be combined.

From the viewpoint of conductivity and storage stability, the metal salt is preferably a metal carboxylate. The carboxylic acid forming the carboxylate is preferably at least one compound selected from the group consisting of formic acid and a carboxylic acid having 1 to 30 carbon atoms, and more preferably a carboxylic acid having 8 to 20 carbon atoms, and even more preferably a fatty acid having 8 to 20 carbon atoms. The fatty acid may be linear or branched or may have a substituent.

Examples of the linear fatty acid include acetic acid, propionic acid, butyric acid, valeric acid, pentanoic acid, hexanoic acid, heptanoic acid, behenic acid, oleic acid, octanoic acid, nonanoic acid, decanoic acid, caproic acid, enanthic acid, caprylic acid, pelargonic acid, capric acid, and undecanoic acid.

Examples of the branched fatty acid include isobutyric acid, isovaleric acid, ethylhexanoic acid, neodecanoic acid, pivalic acid, 2-methylpentanoic acid, 3-methylpentanoic acid, 4-methylpentanoic acid, 2,2-dimethylbutanoic acid, 2,3-dimethylbutanoic acid, 3,3-dimethylbutanoic acid, and 2-ethylbutanoic acid.

Examples of the carboxylic acid having a substituent include hexafluoroacetylacetonate, hydroangelate, 3-hydroxybutyric acid, 2-methyl-3-hydroxybutyric acid, 3-methoxybutyric acid, acetonedicarboxylic acid, 3-hydroxyglutaric acid, 2-methyl-3-hydroxyglutaric acid, and 2,2,4,4-hydroxyglutaric acid.

The metal salt may be a commercially available product or may be manufactured by a known method. For example, a silver salt is manufactured by the following method.

First, a silver compound (for example, silver acetate) functioning as a silver supply source and formic acid or a fatty acid having 1 to 30 carbon atoms in the same quantity as the molar equivalent of the silver compound are added to an organic solvent such as ethanol. The mixture is stirred for a predetermined time by using an ultrasonic stirrer, and the formed precipitate is washed with ethanol and decanted. All of these steps can be performed at room temperature. The mixing ratio of the silver compound and the formic acid or fatty acid having 1 to 30 carbon atoms is preferably 1:2 to 2:1, and more preferably 1:1, in terms of molar ratio.

The metal salt ink may contain a solvent, a reducing agent, a resin, and additives. Preferred aspects of the solvent, reducing agent, resin, and additives are the same as the preferred aspects of the solvent, reducing agent, resin, and additives which may be contained in the metal complex ink.

The viscosity of the metal salt ink is not particularly limited. The viscosity of the metal salt ink may be 0.01 Pas to 5,000 Pa·s, and is preferably 0.1 Pa·s to 100 Pa·s. In a case where the metal salt ink is applied using a spray method or an ink jet recording method, the viscosity of the metal salt ink is preferably 1 mPa·s to 100 mPa·s, more preferably 2 mPa·s to 50 mPa·s, and even more preferably 3 mPa·s to 30 mPa·s.

The viscosity of the metal salt ink is a value measured at 25° C. by using a viscometer. The viscosity is measured, for example, using a VISCOMETER TV-22 type viscometer (manufactured by TOKISANGYO).

The surface tension of the metal salt ink is not particularly limited, and is preferably 20 mN/m to 45 mN/m and more preferably 25 mN/m to 35 mN/m. The surface tension is a value measured at 25° C. by using a surface tensiometer. The surface tension is measured using, for example, DY-700 (manufactured by Kyowa Interface Science Co., Ltd.).

The manufacturing method of the conductive laminate of the present disclosure includes a step of applying at least one conductive ink selected from the group consisting of the metal particle ink, metal complex ink, and metal salt ink described above onto a base material, and a step of baking the applied conductive ink, and it is preferable that the step of applying the conductive ink and the step of baking the conductive ink be repeated two or more times. In addition, in the manufacturing method of the conductive laminate of the present disclosure, the conductive ink may be applied multiple times and then baked. Particularly, in order to obtain a conductive laminate having a first void ratio of 15% to 50% and a second void ratio that is lower than the first void ratio, it is preferable that the manufacturing method of the conductive laminate of the present disclosure include a step of applying the metal particle ink onto a base material and a step of baking the metal particle ink.

Examples of preferred aspects of the manufacturing method of the conductive laminate of the present disclosure include the following aspects.

(1) A method of performing a step of applying a metal particle ink, a baking step, a step of applying a metal complex ink, and a baking step in this order.

(2) A method of performing a step of applying a metal particle ink, a baking step, a step of applying a metal particle ink, and a baking step in this order.

(3) A method of performing a step of applying a metal complex ink, a baking step, a step of applying a metal complex ink, and a baking step in this order.

(4) A method of performing a step of applying a metal particle ink, a baking step, a step of applying a metal complex ink, a baking step, a step of applying a metal complex ink, and a baking step in this order.

(5) A method of performing a step of applying a metal particle ink, a baking step, a step of applying a metal complex ink, a baking step, a step of applying a metal complex ink, a baking step, a step of applying a metal complex ink, and a baking step in this order.

(6) A method of performing a step of applying a metal particle ink, a baking step, a step of applying a metal particle ink, a baking step, a step of applying a metal particle ink, a baking step, a step of applying a metal complex ink, and a baking step in this order.

In a preferred aspect of the above manufacturing method, in a case where the manufacturing method includes a step of applying a metal particle ink that is performed two or more times, the metal particle inks used in the steps may be the same as or different from each other. In addition, in a case where the manufacturing method includes a step of applying a metal complex ink that is performed two or more times, the metal complex inks used in the steps may be the same as or different from each other. The same two inks mean that the inks contain the same type of components at the same content. The two different inks mean that at least the type or content of components contained in the inks varies between the inks.

In a preferred aspect of the above manufacturing method, the baking temperature and baking time may be the same for the baking steps or may vary between the baking steps.

Particularly, it is preferable that the manufacturing method of the conductive laminate of the present disclosure include a step of applying a first conductive ink containing metal particles onto a base material (hereinafter, called "first applying step"), a step of baking the first conductive ink (hereinafter, called "first baking step"), a step of applying a second conductive ink containing a metal salt or a metal complex onto the baked first conductive ink (hereinafter, called "second applying step"), and a step of baking the second conductive ink (hereinafter, called "second baking step").

(First Applying Step)

The first applying step is a step of applying a first conductive ink containing metal particles onto a base material. Details of the base material are as described above.

The method of applying the first conductive ink onto the base material is not particularly limited, and examples thereof include known methods such as a coating method, an ink jet recording method, and a dipping method. Among these, from the viewpoint of making it possible to form a thin conductive ink film by applying once a small amount of the first conductive ink by means of jetting, it is preferable that the first conductive ink be applied using an ink jet recording method in the first applying step.

The ink jet recording method may be any of an electric charge control method of jetting an ink by using electrostatic attraction force, a drop-on-demand method using the vibration pressure of a piezo element (pressure pulse method), an acoustic ink jet method of jetting an ink by using radiation pressure by means of converting electric signals into acoustic beams and irradiating the ink with the acoustic beams, and a thermal ink jet (Bubble Jet (registered trademark)) method of forming bubbles by heating an ink and using the generated pressure.

As the ink jet recording method, particularly, it is possible to effectively use the method described in JP1979-59936A (JP-S54-59936A), which is an ink jet recording method of causing an ink to experience a rapid volume change by the action of thermal energy and jetting the ink from a nozzle by using the acting force resulting from the change of state.

Regarding the ink jet recording method, the method described in paragraphs "0093" to "0105" of JP2003-306623A can also be referred to.

Examples of ink jet heads used in the ink jet recording method include ink jet heads for a shuttle method of using short serial heads that are caused to scan a base material in a width direction of the base material so as to perform recording and ink jet heads for a line method of using line heads that each consist of recording elements arranged for the entire area of each side of a base material.

In the line method, by causing the base material to be scanned in a direction intersecting with the arrangement direction of the recording elements, a pattern can be formed on the entire surface of the base material. Therefore, this method does not require a transport system such as a carriage that moves short heads for scanning.

Furthermore, in the line method, complicated scanning control for moving a carriage and a base material is not necessary, and only a base material moves. Therefore, the forming speed can be further increased in the line method than in the shuttle method.

The amount of the first conductive ink jetted from the ink jet head is preferably 1 pL (picoliter) to 100 pL, more preferably 3 μL to 80 pL, and even more preferably 3 pL to 20 pL.

In the first applying step, at the time of applying the first conductive ink, the temperature of the base material is preferably 20° C. to 120° C., and more preferably 40° C. to 80° C. In a case where the temperature of the base material is 20° C. to 120° C., the influence of base material deformation or the like caused by heat is small, and drying of the ink is facilitated.

(First Baking Step)

The first baking step is a step of baking the first conductive ink.

In the first baking step, the baking temperature is preferably 250° C. or lower, and the baking time is 1 minute to 120 minutes.

The baking temperature is preferably 50° C. to 200° C., and more preferably 60° C. to 120° C. The baking time is preferably 1 minute to 40 minutes. In a case where the baking temperature and the baking time are in the above ranges, it is possible to bake the ink while reducing the influence of base material deformation or the like caused by heat.

The void ratio of the conductive ink film can be adjusted by the baking temperature and the baking time. For example, the higher the baking temperature is, the lower the void ratio tends to be.

The baking method is not particularly limited, and a generally known method can be used.

The time from when the second applying step has finished to when the second baking step is started is preferably 60 seconds or less. The lower limit of the time is not particularly limited, and is, for example, 1 μs. In a case where the time is 60 seconds or less, before the conductive ink permeates the base material, the solvent contained in the conductive ink is removed. As a result, a film having a higher density is likely to be formed on the surface of the conductive ink film.

"When the second applying step has finished" means a point in time when all the droplets of the second conductive ink are landed on the base material.

"When the second baking step is started" refers to a point in time when the base material is placed in the device for the baking step and starts to be heated.

(Second Applying Step)

The second applying step is a step of applying a second conductive ink containing a metal complex onto the baked first conductive ink.

The method of applying the second conductive ink onto the baked first conductive ink is not particularly limited, and examples thereof include known methods such as a coating method, an ink jet recording method, and a dipping method. Among these, from the viewpoint of making it possible to form a thin conductive ink film by applying once a small amount of the conductive ink by means of jetting, it is preferable that the second conductive ink be applied using an ink jet recording method in the second applying step. Details of the ink jet recording method are as described above.

In the second applying step, at the time of applying the second conductive ink, the temperature of the base material is preferably 20° C. to 120° C., and more preferably 40° C. to 80° C.

(Second Baking Step)

The second baking step is a step of baking the second conductive ink.

In the second baking step, the baking temperature is preferably 250° C. or lower, and the baking time is 1 minute to 120 minutes. In a case where the baking temperature and the baking time are in the above ranges, it is possible to bake the ink while reducing the influence of base material deformation or the like caused by heat.

The baking temperature is preferably 50° C. to 200° C., and more preferably 60° C. to 120° C. The baking time is preferably 1 minute to 40 minutes.

The baking method is not particularly limited, and a generally known method can be used.

EXAMPLES

Hereinafter, the present disclosure will be more specifically described based on examples, but the present disclosure is not limited to the following examples as long as the gist of the present disclosure is maintained.

<Preparation of Conductive Ink (Silver Particle Ink)>
(1) Silver Particle Ink A1
—Preparation of Silver Particle Dispersion Liquid 1—

As a dispersant, 6.8 g of polyvinylpyrrolidone (weight-average molecular weight 3,000, manufactured by Sigma-Aldrich Corporation) was dissolved in 100 mL of water, thereby preparing a solution a. In addition, 50.00 g of silver nitrate was dissolved in 200 mL of water, thereby preparing a solution b. The solution a and the solution b were mixed together and stirred, thereby obtaining a mixed solution. At room temperature, 78.71 g of an 85% by mass aqueous N,N-diethylhydroxylamine solution was added dropwise to the mixed solution. In addition, a solution obtained by dissolving 6.8 g of polyvinylpyrrolidone in 1,000 mL of water was slowly added dropwise to the mixed solution at room temperature. The obtained suspension was passed through an ultrafiltration unit (Vivaflow 50 manufactured by Sartorius Stedim Biotech GmbH., molecular weight cut-off: 100,000, number of units: 4) and purified by being passed through purified water until about 5 L of exudate is discharged from the ultrafiltration unit. The supply of purified water was stopped, followed by concentration, thereby obtaining 30 g of a silver particle dispersion liquid 1. The content of solids in this dispersion is 50% by mass. The content of silver in the solids that was measured by TG-DTA (simultaneous measurement of thermogravimetry and differential thermal analysis) (manufactured by Hitachi High-Tech Corporation, model: STA7000 series) was 96.0% by mass. The obtained silver particle dispersion liquid 1 was 20× diluted with deionized water, and measured using a particle size analyzer FPAR-1000 (manufactured by Otsuka Electronics Co., Ltd) to determine the volume-average particle diameter of the silver particles. The volume-average particle diameter of the silver particle dispersion liquid 1 was 60 nm.

—Preparation of Silver Particle Ink A1—

2-Propanol (2 g) and 0.1 g of OLFINE E-1010 (manufactured by Nissin Chemical Industry Co., Ltd.) as a surfactant were added to 10 g of the silver particle dispersion liquid, and water was added thereto such that the silver concentration reaches 40% by mass, thereby obtaining a silver particle ink A1.

(2) Silver Particle Ink A2
—Preparation of Silver Particle Dispersion Liquid 2—

Silver particle dispersion liquid 2 was prepared by the same method as the silver particle dispersion liquid 1, except that the dispersant in the silver particle dispersion liquid 1 was changed to polyvinylpyrrolidone (weight-average molecular weight 6,000, manufactured by Sigma-Aldrich Corporation), and the amount of polyvinylpyrrolidone added was changed to 7.4 g from 6.8 g. The volume-average particle diameter of the silver particle dispersion liquid 2 was 100 nm.

—Preparation of Silver Particle Ink A2—

A silver particle ink A2 was prepared by the same method as the silver particle ink A1, except that the silver particle dispersion liquid 2 was used instead of the silver particle dispersion liquid 1.

<Preparation of Conductive Ink (Silver Complex Ink)>
(1) Silver Complex Ink B1

1-Propanol (5.0 g), 0.17 g of silver acetate, and 0.05 g of formic acid were added to a 50 mL three-neck flask, and the mixture was stirred for 20 minutes. The generated silver salt precipitate was decanted 3 times by using 1-propanol and washed. 1-Propylamine (0.12 g) and 5.0 g of 1-propanol were added to the precipitate, and the mixture was stirred for 30 minutes. Then, 1.0 g of water was added thereto, and the mixture was further stirred, thereby obtaining a solution containing a silver complex. This solution was filtered using a membrane filter made of polytetrafluoroethylene (PTFE) having a pore diameter of 0.45 μm, thereby obtaining a silver complex ink B1.

(2) Silver Complex Ink B2

Isobutylammonium carbonate (6.08 g) and 15.0 g of isopropyl alcohol were added to a 50 mL three-neck flask, and dissolved. Then, 2.0 g of silver oxide was added thereto and reacted at normal temperature for 2 hours, thereby obtaining a homogeneous solution. Furthermore, 0.3 g of 2-hydroxy-2-methylpropylamine was added thereto and stirred, thereby obtaining a solution containing a silver complex. This solution was filtered using a membrane filter made of polytetrafluoroethylene (PTFE) having a pore diameter of 0.45 µm, thereby obtaining a silver complex ink B2.

(3) Silver Complex Ink B3

Silver neodecanoate (2.5 g), 5 g of xylene, and 3.0 g of terpineol were added to a 25 mL three-neck flask, and dissolved. Then, 1 g of tert-octylamine was added thereto and stirred, thereby obtaining a solution containing a silver complex. The reaction was carried out at normal temperature for 2 hours, thereby obtaining a homogeneous solution. This solution was filtered using a membrane filter made of polytetrafluoroethylene (PTFE) having a pore diameter of 0.45 thereby obtaining a silver complex ink B3.

(4) Silver Complex Ink B4

Water (5.0 g), 1.0 g of silver acetate, 1.0 g of ethylenediamine, and 1.0 g of amylamine were added to a 25 mL three-neck flask, and the mixture was stirred for 20 minutes. Formic acid (0.2 g) was added to the obtained solution, and the mixture was further stirred for 30 minutes, thereby obtaining a solution containing a silver complex. This solution was filtered using a membrane filter made of polytetrafluoroethylene (PTFE) having a pore diameter of 0.45 thereby obtaining a silver complex ink B4.

<Preparation of Conductive Ink (Silver Salt Ink)>

Silver Salt Ink C1

Silver neodecanoate (4 g) was added to a 50 mL three-neck flask. Then, 3.0 g of trimethylbenzene and 3.0 g of terpineol were added thereto and stirred, thereby obtaining a solution containing a silver salt. This solution was filtered using a membrane filter made of polytetrafluoroethylene (PTFE) having a pore diameter of 0.45 thereby obtaining a silver salt ink C1.

Example 1

As a base material, a polyethylene terephthalate film (trade name "Viewful UV TP-100", manufactured by KIMOTO) was prepared. The ink cartridge (for 10 picoliters) for an ink jet recording device (trade name "DMP-2850", manufactured by Fujifilm Dimatix Inc) was filled with the silver particle ink A1. As image recording conditions, the resolution was set to 600 dots per inch (dpi), and the jetting amount was set to 10 picoliters/dot. The base material was preheated to 60° C., and a solid image having a width of 5 cm and a length of 10 cm was recorded on the base material at 60° C. (applying step 1). After a lapse of 1 second from when the last ink droplet of the silver particle ink A1 was landed on the base material, the solid image was heated at 150° C. for 20 minutes by using a hot plate (baking step 1). In this way, a conductive ink film having metallic gloss was formed on the base material.

Then, the ink cartridge (for 10 picoliters) for an ink jet recording device (trade name "DMP-2850", manufactured by Fujifilm Dimatix Inc) was filled with the silver complex ink B1. The base material on which the conductive ink film was formed of the silver particle ink A1 was preheated to 60° C., and a solid image was recorded on the base material at 60° C. under the same conditions as the image recording conditions described above such that this solid image overlapped the aforementioned solid image (applying step 2). After a lapse of 1 second from when the last ink droplet of the silver complex ink B1 was landed on the base material, the solid image was heated at 120° C. for 20 minutes by using a hot plate. In this way, a conductive laminate was obtained in which a conductive ink film having metallic gloss and a thickness of 7 µm was formed (baking step 2).

Examples 2 to 18 and Comparative Examples 1 to 6

Conductive laminates were obtained by the same method as in Example 1, except that in Examples 2 to 18 and Comparative Examples 1 to 6, the type of conductive ink, the temperature of the base material, the baking temperature, and the baking time were changed to the conditions described in Tables 1 and 2. Each treatment was performed in the order of the applying step 1, the baking step 1, the applying step 2, the baking step 2, the applying step 3, the baking step 3, the applying step 4, and the baking step 4. For the examples and comparative examples in which the treatment was completed in the baking step 2, "−" is marked in the applying step 3 and the following steps in the tables. In the tables, the thickness (film thickness) of the conductive ink film in each of the conductive laminates is also described.

In Comparative Example 6, the baking temperature in the baking step 1 was low. Therefore, silver was not fully baked, and a black conductive ink film was formed on the base material.

Example 19

In Example 19, a conductive laminate was obtained by the same method as in Example 2, except that the time from when the second applying step has finished to when the second baking step is started was changed to 60 seconds.

By using the conductive laminate obtained in each of the examples and comparative examples, the first void ratio and the second void ratio were measured, and evaluation was performed regarding the surface resistivity and the thermal cycle stability. The measurement results and the evaluation results are shown in the tables.

<Measurement of First Void Ratio and Second Void Ratio>

By using a microtome (trade name RM2255, manufactured by Leica Biosystems Nussloch GmbH), the conductive laminate was cut in a thickness direction of the conductive laminate, thereby obtaining a cross section. By using the obtained cross section and a scanning electron microscope (trade name S-4700, manufactured by Hitachi High-Tech Corporation.), a cross-sectional observation image was obtained.

By using image software ("Adobe Photoshop" manufactured by Adobe Systems, Inc.), threshold values of the obtained cross-sectional observation image were adjusted to obtain a binary image including a white region where a conductive substance is present and a black region where voids are present. In the obtained image, the projection portions at five upper points and the recess portions at five lower points on the side of the ink film surface were averaged, and the position obtained in this way was adopted as an upper side. Furthermore, for the base material side of the ink film, the same calculation as above was performed, and the position obtained by the calculation was adopted as a lower side. The space between the upper side and the lower side was divided into 10 equal parts, and a region from the lower side to the 5th part was defined as a 50% region on the base material side, and a region from the 9th part from the base material side to the upper region was defined as a 10% region on the non-base material side.

The first void ratio was calculated as a ratio of the area of the black region (void) to the total area of the 50% region on the base material side in the cross-sectional observation image.

The second void ratio was calculated as a ratio of the area of the black region (void) to the total area of the 10% region on the non-base material side in the cross-sectional observation image.

<Evaluation of Surface Resistivity>

A printing pattern was formed such that the surface of the conductive ink film had a size of 5 cm×10 cm, thereby obtaining an evaluation sample.

For the conductive ink film in the evaluation sample, by using a resistivity meter (trade name "Loresta GP", manufactured by Mitsubishi Chemical Analytech Co., Ltd.), the surface resistivity [Ω/square] was measured at room temperature (23° C.) by a 4-terminal method. The evaluation standard is as follows. The conductive layer ranked 2 or higher is at a level having no problem for practical use.

5: The surface resistivity is less than 5 mΩ/square.
4: The surface resistivity is 5 mΩ/square or more and less than 10 Ω/square.
3: The surface resistivity is 10 mΩ/square or more and less than 15 Ω/square.
2: The surface resistivity is 15 mΩ/square or more and less than 20 Ω/square.
1: The surface resistivity is 20 Ω/square or more.

<Evaluation of Thermal Cycle Stability>

A printing pattern was formed such that the surface of the conductive ink film had a size of 5 cm×10 cm, thereby obtaining an evaluation sample.

For the conductive ink film in the evaluation sample, by using a resistivity meter (trade name "Loresta GP", manufactured by Mitsubishi Chemical Analytech Co., Ltd.), the volume resistivity was measured in advance.

The evaluation sample was subjected to a thermal cycle test at 60° C. and −20° C. The test was programmed such that the evaluation sample could be alternately heated and cooled for 2 hours at each temperature. The test was performed for 7 days. After the test ended, the surface resistivity of the conductive ink film in the evaluation sample was measured. Based on the amount of change between the surface resistivity before the start of the test and the surface resistivity after the end of the test, the thermal cycle stability was evaluated. The evaluation standard is as follows. It can be said that the smaller the amount of change in the surface resistivity, the better the thermal cycle stability. The conductive layer ranked 2 or higher is at a level having no problem for practical use.

Amount of change=(surface resistivity after end of test)−(surface resistivity before start of test)

5: The amount of change is less than 1.5 Ω/square.
4: The amount of change is 1.5 Ω/square or more and less than 2.0 Ω/square.
3: The amount of change is 2.0 Ω/square or more and less than 2.5 Ω/square.
2: The amount of change is 2.5 Ω/square or more and less than 3.0 Ω/square.
1: The amount of change is 3.0 Ω/square or more.

TABLE 1

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Applying step 1 | Type of conductive ink | A1 | A1 | A2 | A2 | A1 | A1 | A2 | A1 | A2 | A2 |
| | Temperature of base material (° C.) | 60 | 60 | 60 | 60 | 60 | 60 | 60 | 60 | 60 | 60 |
| Baking step 1 | Baking temperature (° C.) | 150 | 130 | 130 | 130 | 130 | 130 | 130 | 130 | 130 | 130 |
| | Baking time (min) | 20 | 20 | 20 | 20 | 20 | 20 | 20 | 20 | 20 | 20 |
| Applying step 2 | Type of conductive ink | B1 | B1 | B1 | A1 | B1 | C1 | C1 | C1 | B2 | A2 |
| | Temperature of base material (° C.) | 60 | 60 | 60 | 60 | 60 | 60 | 50 | 40 | 30 | 60 |
| Baking step 2 | Baking temperature (° C.) | 120 | 120 | 120 | 160 | 120 | 150 | 150 | 150 | 140 | 150 |
| | Baking time (min) | 20 | 20 | 20 | 20 | 20 | 20 | 20 | 20 | 20 | 20 |
| Applying step 3 | Type of conductive ink | — | — | — | — | B1 | C1 | C1 | — | B2 | — |
| | Temperature of base material (° C.) | — | — | — | — | 60 | 60 | 60 | — | 30 | — |
| Baking step 3 | Baking temperature (° C.) | — | — | — | — | 120 | 150 | 150 | — | 140 | — |
| | Baking time (min) | — | — | — | — | 20 | 20 | 20 | — | 20 | — |
| Applying step 4 | Type of conductive ink | | | | | | C1 | C1 | | B2 | |
| | Temperature of base material (° C.) | — | — | — | — | — | 60 | 60 | — | 30 | — |
| Baking step 4 | Baking temperature (° C.) | — | — | — | — | — | 150 | 150 | — | 140 | — |
| | Baking time (min) | — | — | — | — | — | 20 | 20 | — | 20 | — |
| | Second void ratio (%) | 10 | 10 | 10 | 25 | 6 | 4 | 4 | 7 | 25 | 30 |
| | First void ratio (%) | 15 | 35 | 50 | 40 | 35 | 35 | 45 | 35 | 35 | 40 |
| | Film thickness (μm) | 6.5 | 6.5 | 6.5 | 12 | 7 | 8 | 8 | 6.5 | 8 | 12 |
| Evaluation | Surface resistivity | 4 | 4 | 5 | 3 | 4 | 5 | 5 | 5 | 3 | 3 |
| | Thermal cycle stability | 2 | 5 | 2 | 4 | 4 | 5 | 2 | 5 | 4 | 4 |

TABLE 2

|  |  | Example 11 | Example 12 | Example 13 | Example 14 | Example 15 | Example 16 | Example 17 | Example 18 |
|---|---|---|---|---|---|---|---|---|---|
| Applying step 1 | Type of conductive ink | B1 | A1 | A1 | A1 | A1 | A1 | A1 | A1 |
|  | Temperature of base material (° C.) | 60 | 60 | 130 | 60 | 60 | 60 | 60 | 60 |
| Baking step 1 | Baking temperature (° C.) | 120 | 120 | 150 | 260 | 150 | 150 | 130 | 130 |
|  | Baking time (min) | 20 | 20 | 20 | 20 | 20 | 20 | 20 | 20 |
| Applying step 2 | Type of conductive ink | B1 | A1 | B1 | B1 | B1 | B1 | B3 | B4 |
|  | Temperature of base material (° C.) | 60 | 60 | 60 | 60 | 130 | 60 | 60 | 60 |
| Baking step 2 | Baking temperature (° C.) | 120 | 120 | 120 | 120 | 120 | 260 | 130 | 140 |
|  | Baking time (min) | 20 | 20 | 20 | 20 | 20 | 20 |  |  |
| Applying step 3 | Type of conductive ink | — | A1 | — | — | — | — | — | — |
|  | Temperature of base material (° C.) | — | 60 | — | — | — | — | — | — |
| Baking step 3 | Baking temperature (° C.) | — | 120 | — | — | — | — | — | — |
|  | Baking time (min) | — | 20 | — | — | — | — | — | — |
| Applying step 4 | Type of conductive ink | — | A1 | — | — | — | — | — | — |
|  | Temperature of base material (° C.) | — | 60 | — | — | — | — | — | — |
| Baking step 4 | Baking temperature (° C.) | — | 120 | — | — | — | — | — | — |
|  | Baking time (min) | — | 20 | — | — | — | — | — | — |
|  | Second void ratio (%) | 4 | 5 | 10 | 10 | 25 | 5 | 9 | 11 |
|  | First void ratio (%) | 15 | 35 | 45 | 15 | 35 | 20 | 36 | 35 |
|  | Film thickness (μm) | 2 | 20 | 6.5 | 6.5 | 6.5 | 6.5 | 6.5 | 6.5 |
| Evaluation | Surface resistivity | 5 | 5 | 4 | 4 | 3 | 5 | 4 | 4 |
|  | Thermal cycle stability | 2 | 5 | 3 | 2 | 4 | 3 | 5 | 5 |

TABLE 3

|  |  | Comparative Example 1 | Comparative Example 2 | Comparative Example 3 | Comparative Example 4 | Comparative Example 5 | Comparative Example 6 |
|---|---|---|---|---|---|---|---|
| Applying step 1 | Type of conductive ink | A1 | A2 | A1 | A1 | B1 | A1 |
|  | Temperature of base material (° C.) | 60 | 25 | 60 | 60 | 60 | 25 |
| Baking step 1 | Baking temperature (° C.) | 300 | 200 | 150 | 120 | 120 | 100 |
|  | Baking time (min) | 20 | 20 | 20 | 20 | 20 | 10 |
| Applying step 2 | Type of conductive ink | B1 | A2 | A2 | — | — | B1 |
|  | Temperature of base material (° C.) | 60 | 60 | 60 | — | — | 25 |
| Baking step 2 | Baking temperature (° C.) | 120 | 130 | 130 | — | — | 175 |
|  | Baking time (min) | 30 | 20 | 20 | — | — | 60 |

TABLE 3-continued

|  | Comparative Example 1 | Comparative Example 2 | Comparative Example 3 | Comparative Example 4 | Comparative Example 5 | Comparative Example 6 |
|---|---|---|---|---|---|---|
| Second void ratio (%) | 5 | 35 | 35 | 30 | 10 | 30 |
| First void ratio (%) | 9 | 55 | 25 | 30 | 10 | 30 |
| Film thickness (μm) | 6.5 | 12 | 12 | 6 | 1 | 6.5 |
| Evaluation Surface resistivity | 5 | 1 | 1 | 1 | 5 | 1 |
| Thermal cycle stability | 1 | 4 | 3 | 4 | 1 | 3 |

TABLE 4

|  |  | Example 2 | Example 19 |
|---|---|---|---|
| Applying step 1 | Type of conductive ink | A1 | A1 |
|  | Temperature of base material (° C.) | 60 | 60 |
| Baking step 1 | Baking temperature (° C.) | 130 | 130 |
|  | Baking time (min) | 20 | 20 |
| Applying step 2 | Type of conductive ink | B1 | B1 |
|  | Temperature of base material (° C.) | 60 | 60 |
| Baking step 2 | Lapse of time from applying step 2 (sec) | 1 | 60 |
|  | Baking temperature (° C.) | 120 | 120 |
|  | Baking time (min) | 20 | 20 |
|  | Second void ratio (%) | 10 | 20 |
|  | First void ratio (%) | 35 | 35 |
|  | Film thickness (μm) | 6.5 | 6.5 |
| Evaluation | Surface resistivity | 4 | 2 |
|  | Thermal cycle stability | 5 | 5 |

As shown in Tables 1 to 3, it has been found that in Examples 1 to 18, the surface resistivity is low, and the thermal cycle stability is excellent, because Examples 1 to 18 comprise a base material and a conductive ink film provided on the base material, and in a case where a surface of the conductive ink film close to the base material is defined as a first main surface, and a surface of the conductive ink film far from the base material is defined as a second main surface, a first void ratio in a region that extends from the first main surface toward the second main surface to a position being away from the first main surface by a distance equivalent to 50% of a thickness of the conductive ink film is 15% to 50%, and a second void ratio in a region that extends from a position being away from the second main surface toward the first main surface by a distance equivalent to 10% of the thickness of the conductive ink film to the second main surface is lower than the first void ratio.

On the other hand, it has been found that in Comparative Examples 1 and 5, the first void ratio is less than 15%, and the thermal cycle stability is poor.

It has been found that in Comparative Example 2, the first void ratio is higher than 50%, and the surface resistivity is high.

It has been found that in Comparative Examples 3, 4, and 6, the second void ratio is the same as or higher than the first void ratio, and the surface resistivity is high.

It has been found that in Example 1, at the time of applying the first conductive ink in the step of applying the first conductive ink, the temperature of the base material is 20° C. to 120° C., and the thermal cycle stability of Example 1 is better than that of Example 13.

It has been found that in Example 1, in the step of baking the first conductive ink, the baking temperature is 250° C. or lower and the baking time is 1 minute to 120 minutes, and the thermal cycle stability of Example 1 is better than that of Example 14.

As shown in Table 4, it has been found that in Example 2, the time from when the second applying step has finished to when the second baking step is started is 1 second, and the second void ratio and the surface resistivity of Example 2 are higher than those of Example 19 in which the aforementioned time is 60 seconds.

The entire disclosure of Japanese Patent Application No. 2020-165595, filed Sep. 30, 2020 is incorporated into the present specification by reference. In addition, all documents, patent applications, and technical standards described in the present specification are incorporated into the present specification by reference, as if each of the documents, the patent applications, and the technical standards is specifically and individually described.

What is claimed is:

1. A conductive laminate comprising:
a base material; and
a conductive ink film provided on the base material,
wherein the conductive ink film has a first main surface and a second main surface, wherein the first main surface is closer to the base material than the second main surface and the second main surface is farther from the base material than the first main surface,
a region that extends from the first main surface toward the second main surface to a position being away from the first main surface by a distance equivalent to 50% of a thickness of the conductive ink film has a first void ratio of 15% to 50%,
a region that extends from a position being away from the second main surface toward the first main surface by a distance equivalent to 10% of the thickness of the conductive ink film to the second main surface has a second void ratio which is smaller than the first void ratio, the second void ratio is in a range of 4% to 30%, and the conductive ink film comprises at least one metal selected from the group consisting of silver, gold, platinum, nickel, palladium, and copper.

2. The conductive laminate according to claim 1, wherein the first void ratio is 30% to 40%.

3. The conductive laminate according to claim 1, wherein the second void ratio is 20% or less.

4. The conductive laminate according to claim 1, wherein the conductive ink film has a thickness of 0.5 μm to 30 μm.

5. The conductive laminate according to claim 1, wherein a difference between the first void ratio and the second void ratio is 5% to 40%.

6. A method of manufacturing the conductive laminate according to claim 1, the method comprising:

applying a first conductive ink comprising metal particles onto a base material;

baking the first conductive ink;

applying a second conductive ink comprising a metal salt or a metal complex onto the baked first conductive ink;

baking the second conductive ink;

wherein the metal particles are particles comprising at least one metal selected from the group consisting of silver, gold, platinum, nickel, palladium, and copper; and wherein each of the metal salt and the metal complex comprises at least one metal selected from the group consisting of silver, gold, platinum, nickel, palladium, and copper.

7. The method according to claim 6, wherein the metal particles have an average particle diameter of 10 nm to 200 nm.

8. The method according to claim 6, wherein the first conductive ink has a content of the metal particles of 10% by mass to 90% by mass with respect to a total amount of the first conductive ink.

9. The method according to claim 6, wherein the metal complex is a metal complex having a structure derived from at least one compound selected from the group consisting of an ammonium carbamate compound, an ammonium carbonate compound, an alkylamine, and a carboxylic acid having 8 to 20 carbon atoms, and the metal salt is a metal carboxylate having 8 to 20 carbon atoms.

10. The method according to claim 6, wherein the second conductive ink has a content of each of the metal salt and the metal complex of 10% by mass to 90% by mass with respect to a total amount of the second conductive ink.

11. The method according to claim 6, wherein the applying of the first conductive ink comprises applying the first conductive ink using an ink jet recording method, and the applying of the second conductive ink comprises applying the second conductive ink using an ink jet recording method.

12. The method according to claim 6, wherein at the time of applying the first conductive ink in the applying of the first conductive ink, a temperature of the base material is 20° C. to 120° C.

13. The method according to claim 6, wherein in the baking of the first conductive ink, a baking temperature is 250° ° C. or lower, and a baking time is 1 minute to 120 minutes.

14. The method according to claim 6, wherein at the time of applying the second conductive ink in the applying of the second conductive ink, a temperature of the base material is 20° C. to 120° C.

15. The method according to claim 6, wherein in the baking of the second conductive ink, a baking temperature is 250° C. or lower, and a baking time is 1 minute to 120 minutes.

16. The method according to claim 6, wherein a time from when the applying of the second conductive ink has finished to when the baking of the second conductive ink is started is 60 seconds or less.

* * * * *